United States Patent
Delobel et al.

(10) Patent No.: US 11,977,127 B2
(45) Date of Patent: May 7, 2024

(54) METHOD FOR DETECTING A FAULTY CELL IN AN ELECTRIC BATTERY

(71) Applicants: Renault s.a.s., Boulogne-Billancourt (FR); NISSAN MOTOR CO., LTD., Yokohama (JP)

(72) Inventors: Bruno Delobel, Issy les Moulineaux (FR); Benoit Arsac, Versailles (FR); Masato Origuchi, Rambouillet (FR)

(73) Assignees: Renault s.a.s., Boulogne-Billancourt (FR); NISSAN MOTOR CO., LTD., Yokohama (JP)

( * ) Notice: Subject to any disclaimer, the term of this patent is extended or adjusted under 35 U.S.C. 154(b) by 860 days.

(21) Appl. No.: 16/961,865

(22) PCT Filed: Jan. 15, 2019

(86) PCT No.: PCT/EP2019/050970
§ 371 (c)(1),
(2) Date: Jul. 13, 2020

(87) PCT Pub. No.: WO2019/141688
PCT Pub. Date: Jul. 25, 2019

(65) Prior Publication Data
US 2020/0363478 A1 Nov. 19, 2020

(30) Foreign Application Priority Data
Jan. 16, 2018 (FR) ...................... 18 50345

(51) Int. Cl.
*G01R 31/396* (2019.01)
*B60L 58/10* (2019.01)
(Continued)

(52) U.S. Cl.
CPC ............ *G01R 31/396* (2019.01); *B60L 58/10* (2019.02); *G01R 31/006* (2013.01);
(Continued)

(58) Field of Classification Search
CPC ................ G01R 31/006; G01R 31/371; G01R 31/3835; G01R 31/392; G01R 31/396; B60L 58/10; H01M 10/48
(Continued)

(56) References Cited

U.S. PATENT DOCUMENTS 9,366,732 B2 * 6/2016 Fahimi ................. G01R 31/392
2001/0035739 A1 * 11/2001 Laig-Horstebrock ........................
G01R 31/3648
320/132

(Continued)

FOREIGN PATENT DOCUMENTS

AU 2021310405 A1 * 2/2023 .......... H01M 10/441
CN 111602065 A * 8/2020 .............. B60L 58/10
(Continued)

OTHER PUBLICATIONS

International Search Report dated Apr. 5, 2019 in PCT/EP2019/050970 filed on Jan. 15, 2019, 2 pages.

*Primary Examiner* — Atul Trivedi
(74) *Attorney, Agent, or Firm* — Oblon, McClelland, Maier & Neustadt, L.L.P.

(57) ABSTRACT

A method for detecting a faulty cell in an electric battery pack includes the following steps: measuring the no-load voltage at the terminals of each cell of the battery pack; calculating the deviation between the no-load voltage measured at the terminals of the cell and an average known no-load voltage as a function of the number of days during which the battery pack was not used; calculating the difference between the calculated deviation and a quantity n·σ, n being an integer no lower than 1, and σ being a known standard deviation which is a function of the number of days during which the battery pack was not used; and detecting a faulty cell if the difference is greater than zero.

12 Claims, 2 Drawing Sheets

Figure 1:
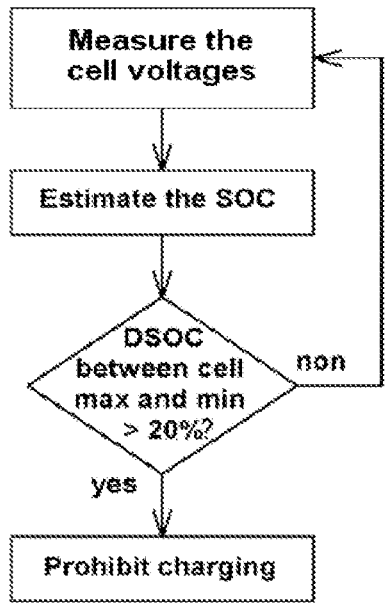

(51) Int. Cl.
  *G01R 31/00* (2006.01)
  *G01R 31/371* (2019.01)
  *G01R 31/3835* (2019.01)
  *G01R 31/392* (2019.01)
  *H01M 10/48* (2006.01)

(52) U.S. Cl.
  CPC ....... *G01R 31/371* (2019.01); *G01R 31/3835* (2019.01); *G01R 31/392* (2019.01); *H01M 10/48* (2013.01)

(58) Field of Classification Search
  USPC ........................................................ 701/34.4
  See application file for complete search history.

(56) References Cited

U.S. PATENT DOCUMENTS

| | | | |
|---|---|---|---|
| 2002/0011820 A1 | 1/2002 | Suzuki et al. | |
| 2004/0001996 A1 | 1/2004 | Sugimoto | |
| 2007/0132456 A1* | 6/2007 | Salman | G01R 31/392 324/426 |
| 2008/0180061 A1 | 7/2008 | Koski et al. | |
| 2011/0084702 A1 | 4/2011 | Mori | |
| 2012/0262180 A1 | 10/2012 | Ishishita | |
| 2012/0299175 A1* | 11/2012 | Tran | G11C 13/0019 257/E23.09 |
| 2015/0028808 A1* | 1/2015 | Bernardi | H02J 7/0048 320/109 |
| 2015/0349385 A1* | 12/2015 | Hu | G01R 31/367 702/63 |
| 2016/0003919 A1* | 1/2016 | Hirschbold | G01R 31/3835 324/433 |
| 2016/0111758 A1* | 4/2016 | Stimm | G01R 31/389 429/90 |
| 2017/0003356 A1* | 1/2017 | Kaib | A61N 1/3708 |
| 2017/0214256 A1* | 7/2017 | Hardy | H02J 7/007182 |
| 2017/0253140 A1* | 9/2017 | Chang | H02J 7/16 |
| 2018/0080993 A1* | 3/2018 | Shimizu | G01R 31/3828 |
| 2018/0123357 A1* | 5/2018 | Beaston | H02J 3/381 |
| 2019/0092230 A1* | 3/2019 | Mohr | B60Q 9/00 |
| 2021/0392416 A1* | 12/2021 | Meißner | H02J 7/0063 |
| 2022/0065940 A1* | 3/2022 | Sudarsan | G01R 31/392 |
| 2023/0184840 A1* | 6/2023 | Simonis | G01R 31/392 702/63 |

FOREIGN PATENT DOCUMENTS

| | | | | |
|---|---|---|---|---|
| CN | 112119317 A | * | 12/2020 | ......... G01R 31/3648 |
| CN | 112166330 A | * | 1/2021 | ......... G01R 31/3648 |
| CN | 112470017 A | * | 3/2021 | ......... G01R 31/3648 |
| CN | 112470453 A | * | 3/2021 | ........... G06F 1/1635 |
| CN | 112534283 A | * | 3/2021 | ............... G01K 7/22 |
| DE | 102019108498 A1 | * | 10/2019 | ............. B60W 10/06 |
| DE | 102008007801 B4 | * | 1/2021 | ....... G01R 19/16542 |
| DE | 102021105697 A1 | * | 10/2021 | ............. B60L 15/20 |
| DE | 102021123978 A1 | * | 3/2023 | ........... G01R 31/387 |
| EP | 2 518 522 A1 | | 10/2012 | |
| EP | 3875974 A1 | * | 9/2021 | ........... G01R 31/367 |
| EP | 2944012 B1 | * | 3/2023 | ................ B60L 1/00 |
| FR | 3010532 A1 | * | 3/2015 | ................ B60L 3/12 |
| GR | WO-2016102823 A1 | * | 6/2016 | ......... G01R 31/3651 |
| JP | 2002-10511 A | | 1/2002 | |
| KR | 101779245 B1 | * | 9/2017 | ............. G01R 31/36 |
| WO | WO-2014088325 A1 | * | 6/2014 | ........... G01R 19/165 |
| WO | WO-2014166852 A2 | * | 10/2014 | ............. B60L 11/12 |
| WO | 2015/037292 A1 | | 3/2015 | |
| WO | WO-2016083758 A1 | * | 6/2016 | ........... G01R 31/367 |
| WO | WO-2016102823 A1 | * | 6/2016 | ......... G01R 31/3651 |
| WO | WO-2019141688 A1 | * | 7/2019 | ............. B60L 58/10 |
| WO | WO-2022251026 A2 | * | 12/2022 | |

* cited by examiner

METHOD FOR DETECTING A FAULTY CELL IN AN ELECTRIC BATTERY

The invention relates to a method for detecting a faulty cell in an electric battery.

At the present time, there is a diagnostic procedure that makes it possible to protect an imbalanced battery pack from faulty cells. However, this imbalance is not necessarily due to a faulty cell, but quite simply to a dispersion of the self-discharging.

Specifically, this diagnostic procedure generally consists in measuring the voltage in order to estimate the SOC (state of charge) difference between the most charged cell and the least charged one. Thus, if this difference is greater than a predetermined threshold value, recharging of the vehicle will be prohibited. The vehicle, once it has discharged, will therefore be immobilized and will have to be returned to the dealership in order to be repaired. However, as we have been able to demonstrate, it is possible to have a "natural" self-discharging dispersion, inherent to a technology or to a production batch, that could give the incorrect impression that the battery pack contains at least one faulty cell. Thus, if a client uses his vehicle only very infrequently, he does not benefit from a long time to balance the cells. In this situation, a client may have a battery pack that is completely functional but that, after a certain time, is no longer able to be charged, as it will be diagnosed as faulty since the SOC difference between the cell having the minimum SOC and the cell having the maximum SOC will be greater than the predetermined threshold value.

In order to detect cells unsuitable for a given use or at the end of life, and therefore not to keep them for the given use, U.S. Pat. No. 8,332,342 discloses a method in which the internal electrochemical behavior of a cell when it draws the discharge current for the given use is mathematically modeled, and then its theoretical SOC and terminal voltage after said use are deduced therefrom. Thus, depending on the theoretical SOC and terminal voltage, the cell is or is not kept for the given use.

The method described in that document has the drawback of being very complex to implement, since it requires very accurate knowledge of the electrochemistry of the cell and very high computational capabilities.

The current methods thus either do not have sufficient performance in order to distinguish an actual fault from natural discharging, or are very complex to implement.

A detection method according to the invention makes it possible to safely, easily and reliably detect a faulty cell in a battery pack, while overcoming the drawbacks highlighted in the prior art, in particular by not creating a confusion with natural self-discharging.

One subject of the invention is a method for detecting a defective cell in an electric battery pack.

The main feature of a method according to the invention is that it comprises the following steps:
 a step of measuring the no-load voltage across the terminals of each cell of the battery pack,
  a step of calculating the deviation between the no-load voltage measured across the terminals of said cell and an average no-load voltage known depending on the number of days of lack of use of the battery pack,
  a step of calculating the difference between said calculated deviation and a variable n·σ, where n is an integer greater than or equal to one, and σ is a known standard deviation that depends on the number of days of lack of use of the battery pack,
  a step of detecting a defective cell if said difference is greater than zero.

This method thus makes it possible to individually test each of the cells forming the battery pack in order to detect an actual fault with at least one of the cells. It is based on comparing a calculated deviation between a no-load voltage measurement of a cell and an average no-load voltage that each cell should have depending on the number of days of lack of use of the battery with a variable proportional to the standard deviation. The criteria used to establish a diagnosis of an actual fault with a cell are therefore more complete and more accurate than a simple evaluation of a dispersion of the states of charge of the cells forming the battery pack. Such a method is preferably performed in a motor vehicle by way of a computer. Advantageously, a driver is informed of the presence of at least one faulty cell in the battery pack by virtue of a method according to the invention when starting up his vehicle. The terms "faulty" and "defective" assigned to a cell are equivalent.

Advantageously, n is an integer between 2 and 10.

Preferably, a method according to the invention comprises a warning step when a defective cell is detected. Specifically, if a defective cell is detected, means are implemented in order to prevent the battery from being recharged. It is important that the driver of the vehicle is informed of such a fault so as to take the required measures as early as possible.

The warning step preferably uses a visual signal visible to a person implementing the method. Advantageously, the visual signal is given by way of a specific indicator light, activated on a screen of a dashboard of the vehicle.

Advantageously, the warning step uses an audio signal audible to a person implementing the method.

Advantageously, a detection method according to the invention implements a step preventing the battery pack from being recharged when at least one defective cell is detected. In this way, as soon as a defective cell is detected, the battery is no longer able to be recharged, meaning that a user has to visit a professional in order to replace the defective cell.

Preferably, if $\sigma \geq 5$ mV, then n=6.
Preferably, if $\sigma \geq 10$ mV, then n=4.
Advantageously, if $\sigma \geq 20$ mV, then n=3.

Advantageously, a detection method according to the invention comprises a step of displaying a loss of autonomy in the event of detecting a defective cell. Thus, when a cell is faulty, this is reflected in a drop in the autonomy of the vehicle, and the driver of the vehicle is immediately informed thereof.

A detection method according to the invention has the advantage of safely and reliably detecting an actual fault with a cell of a battery pack, by in particular eliminating the configurations for which some cells discharge naturally over time more quickly than others.

Figure 2:
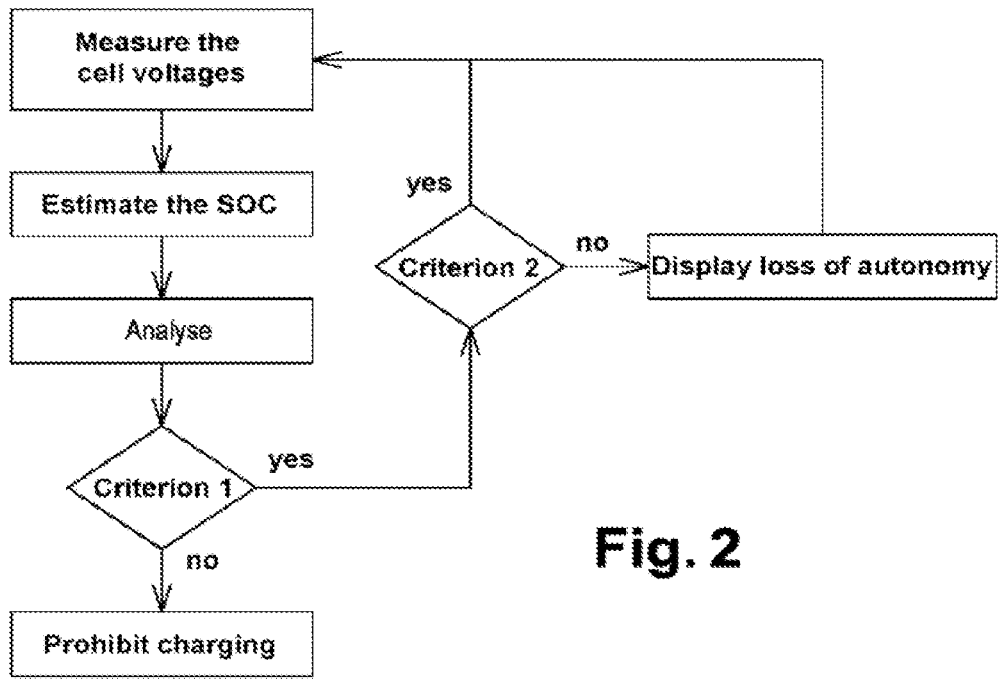
Figure 3:
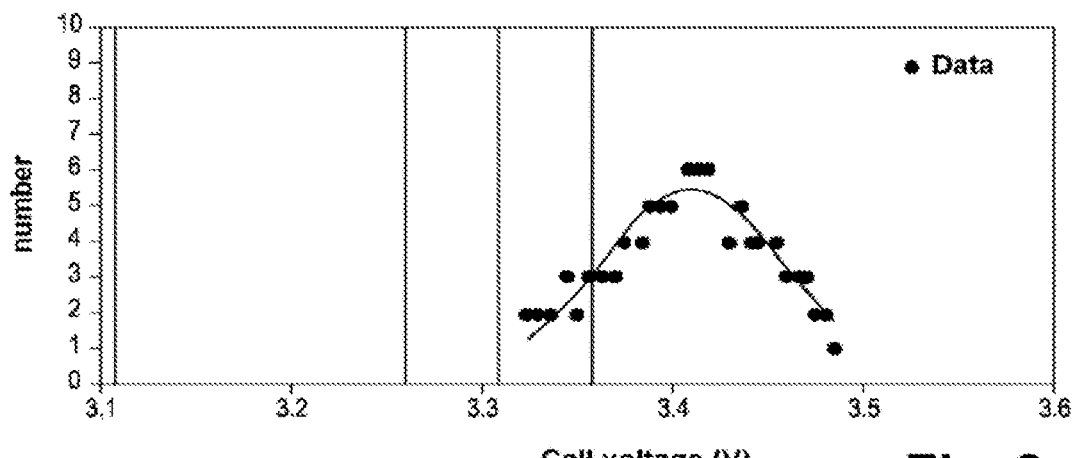
Figure 4:
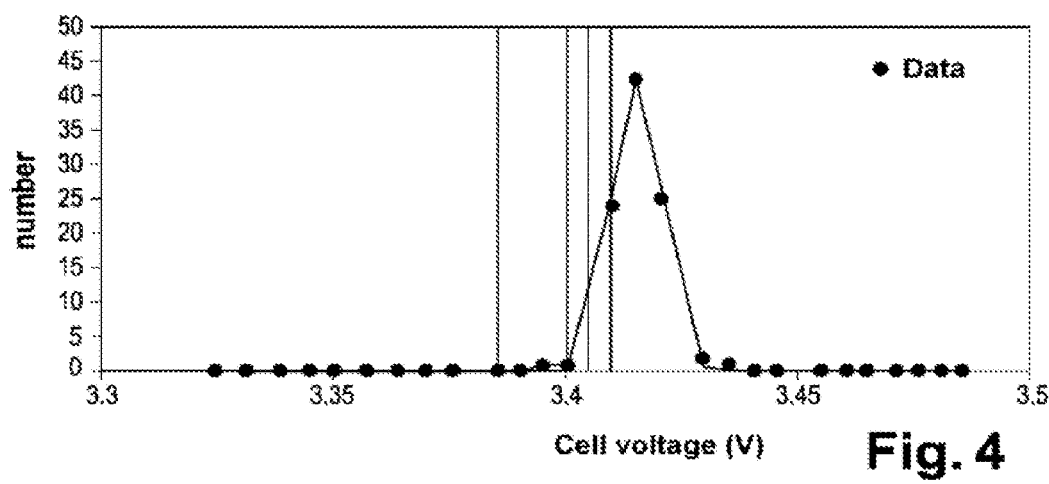
Figure 5:
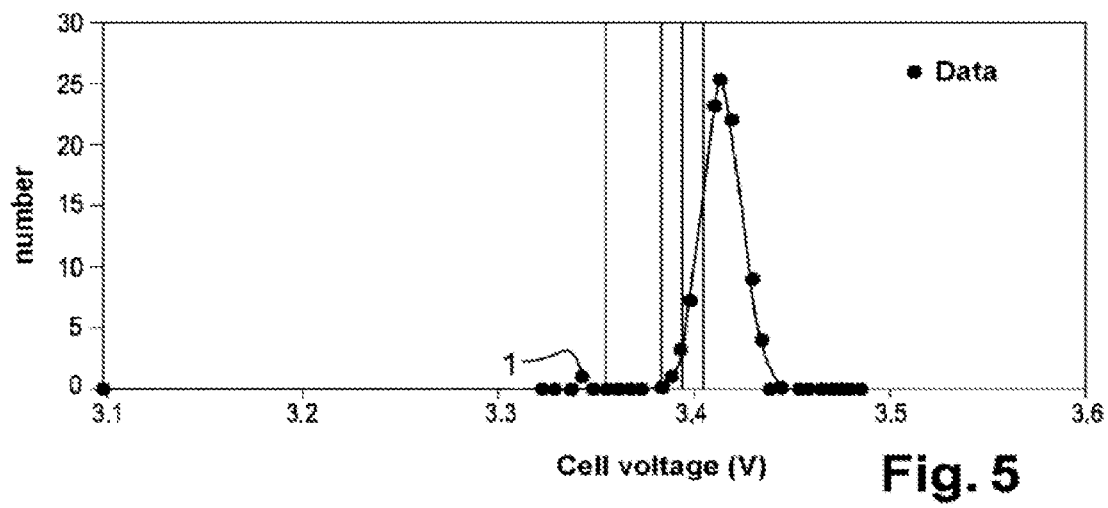

A detailed description is given hereinafter of one preferred embodiment of a detection method according to the invention with reference to the following figures:

FIG. 1 is a flowchart illustrating the main steps of a method for detecting a defective cell according to the prior art, FIG. 2 is a flowchart illustrating the main steps of a method for detecting a defective cell according to the invention, FIG. 3 is a graph illustrating a first example of a distribution of functional cells of a battery pack as a function of a measured no-load voltage, FIG. 4 is a graph illustrating a second example of a distribution of functional cells of a battery pack as a function of a measured no-load voltage, FIG. 5 is a graph illustrating a third example of a distribution of functional cells of a battery pack as a function of a measured no-load voltage, showing a defective cell.

With reference to FIG. 1, a method from the prior art for detecting a faulty electric cell in a battery pack comprises:
- a step of measuring the voltage across the terminals of each cell of the battery pack,
- a step of estimating the SOC of each of said cells,
- a step of determining the SOC difference between the most charged cell and the least charged cell,
- a step of detecting a faulty cell if this difference is greater than or equal to a predetermined value, which may for example be equal to 20% or 30%.

The detection of at least one faulty cell in the battery pack is generally accompanied by a step of prohibiting charging of said pack, since, due to the presence of at least one faulty cell, this pack is deemed to be non-operational. Before being able to recharge it, it is therefore necessary to replace each faulty cell with a new cell equipped with its full capacities. Now, such a method is relatively limited as it does not take into account natural discharging of a battery cell over time, in the case for example of prolonged lack of use of the vehicle. In other words, this method is not able to conclusively distinguish a faulty cell from a valid but discharged cell.

A detection method according to the invention has features that make it possible to reliably and unequivocally distinguish a faulty cell from a healthy but discharged cell.

In this way, with reference to FIG. 2, a method for detecting a faulty cell in a battery pack according to the invention comprises the following steps:
- a step of measuring the no-load voltage across the terminals of each cell of the battery pack,
- a step of calculating the deviation between the no-load voltage measured across the terminals of said cell and an average no-load voltage known depending on the number of days of lack of use of the battery,
- a step of calculating the difference between said calculated deviation and the variable n·σ, where n is an integer greater than or equal to one, and σ is a known standard deviation that depends on the number of days of lack of use of the battery,
- a step of detecting a defective cell if said difference is greater than zero.

In contrast to the method from the prior art described above, a method according to the invention proposes a more realistic approach by incorporating the phenomenon of the natural loss of charge of a cell when the battery pack is not used for a certain number of days. In this way, this natural loss of charge will no longer be liable to bias the conditions for detecting a faulty cell.

The variable n·σ is able to be adjusted depending on the value of the standard deviation σ. In this way, by way of examples exhibiting numerous advantages,
- if σ>5 mV, then n may be set to 6,
- if σ>10 mV, then n may be set to 4,
- if σ>20 mV, then n may be set to 3.

FIG. 3 illustrates a first exemplary distribution of the cells of a battery pack as a function of the no-load voltage measured across the terminals of each of said cells. In other words, each point represents the number of cells having the same measured no-load voltage. It may be observed that, when none of the cells are faulty, all of the points are organized around a Gaussian average. The variation in the measured voltages and therefore in the states of charge between the cells is due to a self-discharging phenomenon that is more or less pronounced from one cell to another.

FIG. 4 illustrates a second exemplary distribution of the cells of a battery pack as a function of the no-load voltage measured across the terminals of each of said cells. All of the points are coherent as they make it possible to define a distribution curve that is continuous and regular, without emphasizing a single point that would leave this curve. The battery pack at the origin of all of these voltage measurements therefore does not have any faulty electric cell.

FIG. 5 illustrates a third exemplary distribution of the cells of a battery pack as a function of the no-load voltage measured across the terminals of each of said cells. In contrast to the regular curve illustrated in FIG. 4, the graph of FIG. 5 shows a singular point 1, situated slightly outside the curve representing the distribution of the cells as a function of the no-load voltage measured across the terminals of said cells. This point reflects the presence of a cell of the battery pack that is actually faulty. Under these conditions, the battery is immobilized and it is no longer possible to recharge it.

A detection method according to the invention is implemented in a vehicle equipped with an electric battery, by way of an on-board computer having appropriate software, and of various apparatuses for measuring voltages across the terminals of each cell. In this way, when the driver switches on the ignition, he is immediately and directly informed about the state of his battery.

In this regard, once the presence of at least one faulty cell has been detected, a detection method according to the invention implements a warning step allowing the driver to be informed about the presence of a faulty cell. This warning step may be performed for example by way of an indicator light appearing on a dashboard or a characteristic audio signal.

A detection method according to the invention may also implement a step of automatically blocking recharging of the battery, if at least one electric cell of said battery proves to be faulty and is not replaced.

The invention claimed is:

1. A method for detecting a defective cell in an electric battery pack, comprising:
    measuring a no-load voltage across terminals of each cell of the battery pack;
    calculating a deviation between the no-load voltage measured across the terminals of said each cell and an average no-load voltage known depending on a number of days of lack of use of the battery pack;
    calculating a difference between said calculated deviation and a variable n·σ, where n is an integer greater than or equal to one, and σ is a known standard deviation that depends on the number of days of lack of use of the battery pack; and
    detecting a defective cell when said difference is greater than zero.

2. The method as claimed in claim 1, wherein n is an integer between 2 and 10.

3. The method as claimed in claim 1, further comprising outputting a warning when the defective cell is detected.

4. The method as claimed in claim 3, wherein the outputting outputs the warning using a visual signal visible to a person implementing the method.

5. The method as claimed in claim 3, wherein the outputting outputs the warning using an audio signal audible to a person implementing the method.

6. The method as claimed in claim 1, further comprising preventing the battery pack from being recharged when at least one defective cell is detected.

7. The method as claimed in claim 1, wherein, when σ≥5 mV, then n=6.

8. The method as claimed in claim 1, wherein, when σ≥10 mV, then n=4.

9. The method as claimed in claim 1, wherein, when σ≥20 mV, then n=3.

10. The method as claimed in claim 1, further comprising displaying a loss of autonomy when a faulty cell is detected.

11. An apparatus for detecting a defective cell in an electric battery pack, comprising:
processing circuitry configured to
measure a no-load voltage across terminals of each cell of the battery pack,
calculate a deviation between the no-load voltage measured across the terminals of said each cell and an average no-load voltage known depending on a number of days of lack of use of the battery pack,
calculate a difference between said calculated deviation and a variable n·σ, where n is an integer greater than or equal to one, and σ is a known standard deviation that depends on the number of days of lack of use of the battery pack, and
detect a defective cell when said difference is greater than zero.

12. A non-transitory computer-readable storage medium including computer executable instructions, wherein the instructions, when executed by a computer, cause the computer to perform a method for detecting a defective cell in an electric battery pack, the method comprising:
measuring a no-load voltage across terminals of each cell of the battery pack;
calculating a deviation between the no-load voltage measured across the terminals of said each cell and an average no-load voltage known depending on a number of days of lack of use of the battery pack;
calculating a difference between said calculated deviation and a variable n·σ, where n is an integer greater than or equal to one, and σ is a known standard deviation that depends on the number of days of lack of use of the battery pack; and
detecting a defective cell when said difference is greater than zero.

* * * * *